(12) United States Patent
Yamada

(10) Patent No.: US 12,200,826 B2
(45) Date of Patent: Jan. 14, 2025

(54) SUBSTRATE PROCESSING APPARATUS AND NOISE IMPACT REDUCING METHOD

(71) Applicant: Tokyo Electron Limited, Tokyo (JP)

(72) Inventor: Kazuhito Yamada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 647 days.

(21) Appl. No.: 17/411,603

(22) Filed: Aug. 25, 2021

(65) Prior Publication Data

US 2022/0070977 A1  Mar. 3, 2022

(30) Foreign Application Priority Data

Aug. 26, 2020  (JP) ................................. 2020-142367

(51) Int. Cl.
*H05B 3/00* (2006.01)
*G05D 23/19* (2006.01)
*H01L 21/683* (2006.01)

(52) U.S. Cl.
CPC ....... *H05B 3/0019* (2013.01); *G05D 23/1917* (2013.01); *H01L 21/6833* (2013.01)

(58) Field of Classification Search
CPC ............. H05B 3/0019; G05D 23/1917; H01L 21/6833
See application file for complete search history.

(56) References Cited

U.S. PATENT DOCUMENTS

| | | | | |
|---|---|---|---|---|
| 6,337,643 | B1* | 1/2002 | Gabet | G06F 1/02 708/250 |
| 2007/0270116 | A1* | 11/2007 | Kouwenhoven | H04B 1/30 455/283 |
| 2010/0149385 | A1* | 6/2010 | Tay | H04N 25/60 348/241 |
| 2017/0372928 | A1* | 12/2017 | Yamada | H05B 1/0233 |
| 2019/0104265 | A1* | 4/2019 | Totsuka | H04N 25/63 |
| 2021/0120883 | A1* | 4/2021 | Marubashi | H05B 3/0019 |

FOREIGN PATENT DOCUMENTS

JP  2019-212670 A  12/2019

* cited by examiner

*Primary Examiner* — Janie M Loeppke
*Assistant Examiner* — Theodore J Evangelista
(74) *Attorney, Agent, or Firm* — Pearne & Gordon LLP

(57) ABSTRACT

A substrate processing apparatus includes an AD converter configured to output digital values of a voltage applied to a heater resistor and a current flowing in the heater resistor; and a controller configured to control a temperature of the heater resistor by using a calculation voltage and a calculation current configured to calculate a resistance value of the heater resistor, which are obtained from an output result of the AD converter. The controller calculates at least one of the calculation voltage or the calculation current, based on a combination result of a digital signal obtained from the output result of the AD converter and a noise signal including a normal distribution noise.

9 Claims, 11 Drawing Sheets

SUBSTRATE PROCESSING APPARATUS AND NOISE IMPACT REDUCING METHOD

CROSS-REFERENCE TO RELATED APPLICATION

This application claims the benefit of Japanese Patent Application No. 2020-142367 filed on Aug. 26, 2020, the entire disclosure of which is incorporated herein by reference.

TECHNICAL FIELD

The various aspects and embodiments described herein pertain generally to a substrate processing apparatus and a noise impact reducing method.

BACKGROUND

In a substrate processing apparatus, heater temperature control is performed, as well-known in the art (for example, see Patent Document 1).
Patent Document 1: Japanese Patent Laid-open Publication No. 2019-212670

SUMMARY

In one exemplary embodiment, a substrate processing apparatus includes an AD converter configured to output digital values of a voltage applied to a heater resistor and a current flowing in the heater resistor; and a controller configured to control a temperature of the heater resistor by using a calculation voltage and a calculation current configured to calculate a resistance value of the heater resistor, which are obtained from an output result of the AD converter. The controller calculates at least one of the calculation voltage or the calculation current, based on a combination result of a digital signal obtained from the output result of the AD converter and a noise signal including a normal distribution noise.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
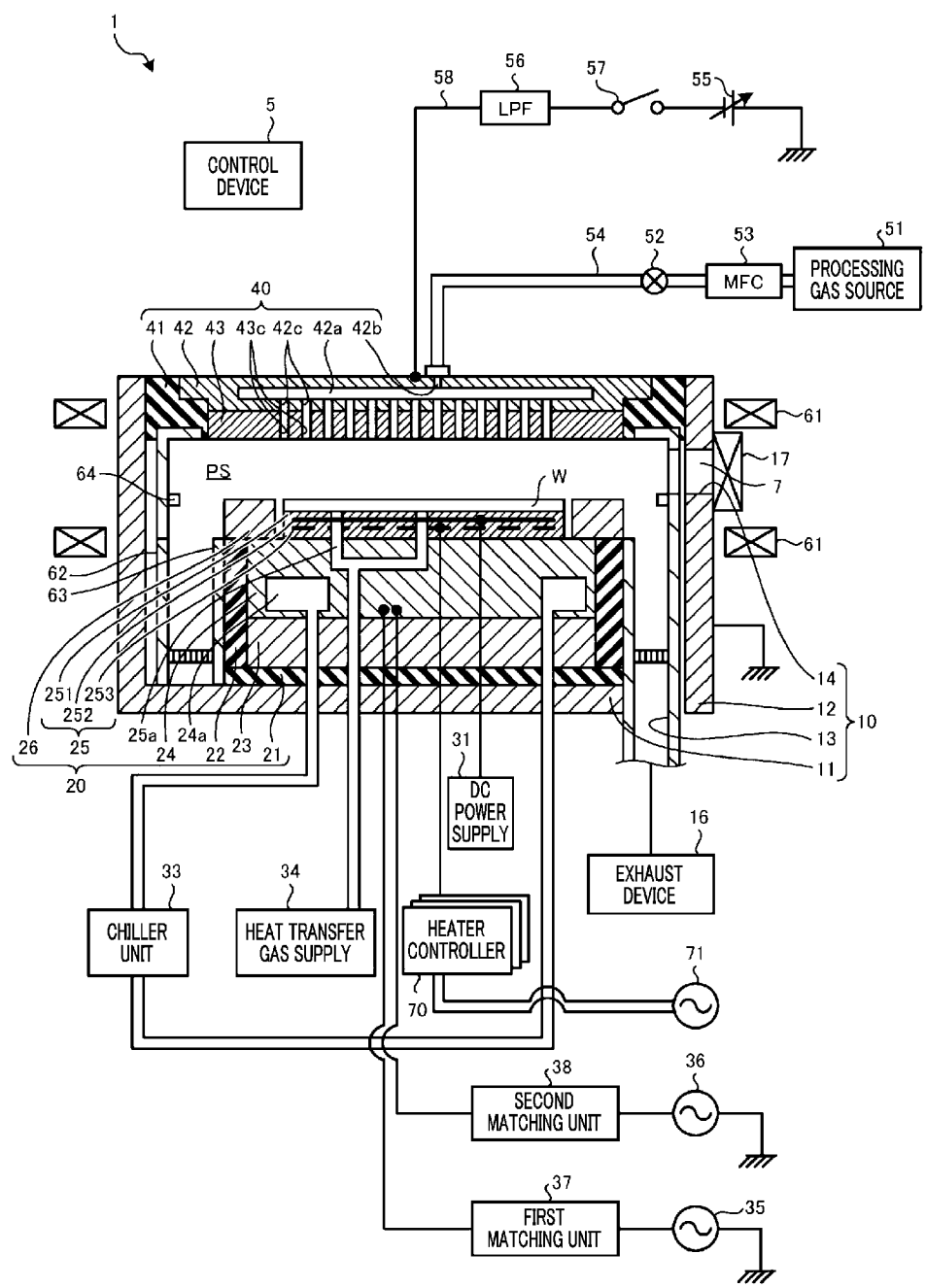
FIG. 1 is a diagram illustrating an example of a schematic configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, a substrate processing apparatus and a noise impact reducing method according to exemplary embodiments of the present disclosure will be described in detail with reference to the accompanying drawings. It should be noted that the substrate processing apparatus and the noise impact reducing method of the present disclosure are not limited by the exemplary embodiments.

When controlling a heater temperature in a substrate processing apparatus, a resistance value of a heater resistor may be calculated. A voltage value and a current value for calculating the resistance value of a heater are obtained from an output result of an AD converter, and the output result of the AD converter includes a noise of the AD converter. This noise included in the output result of the AD converter degrades control accuracy for the heater temperature as well as the calculation accuracy for the resistor. In this regard, there is a demand for a technique capable of improving control accuracy for the heater temperature.

Hereinafter, exemplary embodiments of a substrate processing apparatus and a noise impact reducing method according to the present disclosure will be described in detail with reference to the accompanying drawings. Further, the present disclosure is not limited by the following exemplary embodiments. Unless contradictory, the disclosures in the various exemplary embodiments can be appropriately combined.

FIG. 1 illustrates an exemplary schematic configuration of a substrate processing apparatus according to an exemplary embodiment. Hereinafter, each component of a substrate processing apparatus 1 will be described.

The substrate processing apparatus 1 includes a chamber 10, an exhaust device 16 and a gate valve 17. FIG. 1 shows a transversal cross-sectional view of the chamber 10. In this example, the chamber 10 includes a bottom wall 11 and a side wall 12, and has a substantially cylindrical shape. The chamber 10 is made of, for example, aluminum. An inner surface of the chamber 10 (an inner surface of the bottom wall 11 and/or the side wall 12) may be coated with an anodic oxide film. A space in which a substrate (a wafer W in this example) is processed inside the chamber 10 will be referred to as "processing space PS". The processing space PS is isolated from an external atmosphere by the chamber 10. An exhaust port 13 connected to the exhaust device 16 is formed at the bottom wall 11 of the chamber 10. The exhaust device 16 exhausts gas from the processing space PS through the exhaust port 13 to depressurize the processing space PS to a predetermined vacuum level. An opening 14 connected to the gate valve 17 is formed at the side wall 12 of the chamber 10. The gate valve 17 opens and closes the opening 14.

The substrate processing apparatus 1 further includes a placing table 20. The placing table 20 is placed under the processing space PS inside the chamber 10. The placing table 20 includes an insulating plate 21, an inner wall member 22, a support 23, a base member 24, an electrostatic chuck 25 and an edge ring 26.

The insulating plate 21 and the inner wall member 22 have an insulating property and insulate the other part of the placing table 20 from the chamber 10. The insulating plate 21 is placed on the bottom wall 11 of the chamber 10. The insulating plate 21 has a disc shape. The inner wall member 22 is placed on a peripheral portion of the insulating plate 21. The inner wall member 22 has a cylindrical shape. The inner wall member 22 is made of, for example, quartz.

The support 23 and the base member 24 are placed inside the inner wall member 22. The support 23 has a conductive property and is placed on the insulating plate 21. The base member 24 is placed on the support 23. The base member 24 is made of, for example, aluminum. A coolant circulation path 24a connected to a chiller unit 33 to be described later is provided within the base member 24.

The electrostatic chuck 25 is placed on the base member 24. The electrostatic chuck 25 includes a main body 251, an electrode 252 and a plurality of heaters 253. The main body 251 has an insulating property. The electrode 252 and the heaters 253 are buried in the main body 251. In this example, the electrostatic chuck 25 includes the plurality of heaters 253. A heat transfer gas supply path 25a is formed to penetrate the electrostatic chuck 25 to a top surface of the electrostatic chuck 25. The electrostatic chuck 25 and the plurality of heaters 253 will be described in more detail with reference to FIG. 2.

Figure 2:
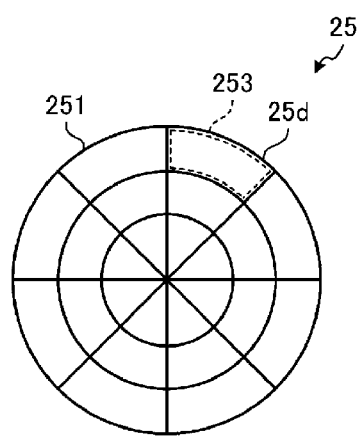
FIG. 2 illustrates an example of a plan view of an electrostatic chuck.

FIG. 2 shows an exemplary plan view of an electrostatic chuck. The top surface of the electrostatic chuck 25 is divided into a plurality of regions 25d. In this example, the top surface of the electrostatic chuck 25 is divided into three regions in a diametrical direction and eight regions in a circumferential direction, but is not particularly limited thereto. The plurality of heaters 253 is buried in the corresponding regions 25d, respectively. When AC power is supplied from an AC power supply 71 (FIG. 1), the heaters 253 heat the corresponding regions 25d of the electrostatic chuck 25.

Referring to FIG. 1 again, the edge ring 26 is placed on the inner wall member 22 and the base member 24 so that the electrostatic chuck 25 is disposed inside the edge ring 26. The edge ring 26 is made of, for example, single-crystal silicon.

The substrate processing apparatus 1 further includes a DC power supply 31, the chiller unit 33 and a heat transfer gas supply 34. The DC power supply 31 applies a DC voltage to the electrode 252 of the electrostatic chuck 25. The chiller unit 33 cools a coolant to a predetermined temperature, and circulates the cooled coolant in the coolant circulation path 24a. The heat transfer gas supply 34 supplies a heat transfer gas (for example, He gas) to a space between the substrate (the wafer W in this example) and the electrostatic chuck 25 through the heat transfer gas supply path 25a.

The substrate processing apparatus 1 further includes a plurality of heater controllers 70. The plurality of heater controllers 70 are provided corresponding to the plurality of heaters 253, respectively. The heaters 253 are supplied with power from the AC power supply 71. The AC power supply 71 may be, for example, a commercial power supply (with an effective value of about 200 V and a frequency of 50 Hz). The heater controllers 70 and the heaters 253 will be described in more detail with reference to the drawings after FIG. 3.

The substrate processing apparatus 1 further includes a first high frequency power supply 35 and a second high frequency power supply 36. The first high frequency power supply 35 supplies high frequency power having a first frequency (for example, 100 MHz) to the base member 24 via a first matching unit 37. The second high frequency power supply 36 supplies high frequency power having a second frequency (for example, 13 MHz) lower than the first frequency to the base member 24 via a second matching unit 38.

The substrate processing apparatus 1 further includes a shower head 40. The shower head 40 is located above the placing table 20 inside the processing space PS so that a bottom surface of the shower head 40 faces the placing table 20 and the plane of the bottom surface of the shower head 40 is substantially parallel to the plane of a top surface of the placing table 20.

The shower head 40 includes an insulating member 41, a main body 42 and an upper ceiling plate 43.

The insulating member 41 insulates the other part of the shower head 40 from the chamber 10. The insulating member 41 is supported at an upper portion of the chamber 10. The main body 42 has a conductive property and is supported by the insulating member 41. The main body 42 is made of, for example, aluminum and may have an anodically oxidized surface. The main body 42 and the base member 24 are used as an upper electrode and a lower electrode (a pair of electrodes). The upper ceiling plate 43 is placed under the main body 42 and supported by the main body 42 so as to be detachable from the main body 42. The upper ceiling plate 43 is made of a silicon-containing material such as quartz.

A gas diffusion chamber 42a, a gas inlet 42b and gas outlets 42c are formed in the main body 42. The gas diffusion chamber 42a is formed inside the main body 42. The gas inlet 42b is formed above the gas diffusion chamber 42a in the main body 42 and communicates with the gas diffusion chamber 42a. A plurality of gas outlets 42c is formed on the upper ceiling plate 43 side of the gas diffusion chamber 42a in the main body 42 and communicates with the gas diffusion chamber 42a.

A plurality of gas inlets 43c is formed in the upper ceiling plate 43. The plurality of gas inlets 43c is formed so as to penetrate a top surface and a bottom surface of the upper ceiling plate 43 and communicates with the plurality of gas outlets 42c, respectively.

The substrate processing apparatus 1 further includes a processing gas source 51, a valve 52 and a mass flow controller (MFC) 53.

The processing gas source 51 is connected to the gas inlet 42b in the main body 42 of the shower head 40 via a pipe 54.

The mass flow controller 53 is provided in the middle of the pipe 54. The valve 52 is provided between the mass flow controller 53 and the gas inlet 42b in the pipe 54. When the valve 52 is opened or closed, the amount of processing gas to be supplied from the processing gas source 51 to the gas inlet 42b is adjusted.

The substrate processing apparatus 1 further includes a variable DC power supply 55, a low pass filter (LPF) 56 and a switch 57. The variable DC power supply 55 is electrically connected to the main body 42 of the shower head 40 via an electric path 58. The low pass filter 56 and the switch 57 are provided in the middle of the electric path 58. The switch 57 is opened and closed so as to apply a DC voltage to the shower head 40.

The substrate processing apparatus 1 further includes a ring magnet 61. The ring magnet 61 forms a magnetic field between the shower head 40 and the placing table 20 in the processing space PS. The ring magnet 61 is arranged concentrically with the chamber 10 so that the chamber 10 is disposed inside the ring magnet 61. The ring magnet 61 is rotatably supported by the chamber 10 via a non-illustrated rotation mechanism. The ring magnet 61 is formed of, for example, a permanent magnet.

The substrate processing apparatus 1 further includes a deposition shield 62, a deposition shield 63 and a conductive member 64. The deposition shield 62 suppresses adhesion of an etching byproduct (deposit) to an inner peripheral surface of the side wall 12 of the chamber 10. The deposition shield 62 is placed to cover the inner peripheral surface of the side wall 12 of the chamber 10 and supported by the chamber 10 to be detachable from the chamber 10. The deposition shield 63 suppresses adhesion of an etching byproduct to an outer peripheral surface of the inner wall member 22. The deposition shield 63 is placed to cover the outer peripheral surface of the inner wall member 22. The conductive member 64 suppresses abnormal discharge inside the chamber 10. The conductive member 64 is arranged in the processing space PS so that the height at which the conductive member 64 is arranged is substantially the same as the height at which the wafer W placed on the electrostatic chuck 25 is arranged, and the conductive member 64 is supported by the deposition shield 62. The conductive member 64 is electrically connected to a ground.

The substrate processing apparatus 1 further includes a control device 5. The control device 5 controls the entire substrate processing apparatus 1 by controlling each component of the substrate processing apparatus 1. The control device 5 is implemented by a computer including, for example, a central processing unit (CPU), a random access memory (RAM) and a read only memory (ROM).

An outline of operations for substrate processing (plasma etching) performed by the above-described substrate processing apparatus 1 will be described. The opening 14 is opened by controlling the gate valve 17. The wafer W is carried into the processing space PS through the opening 14 and then placed on the placing table 20. The DC power supply 31 applies a DC voltage to the electrode 252 so as to hold the wafer W on the electrostatic chuck 25 by Coulomb force. The opening 14 is closed by controlling the gate valve 17. Then, the atmosphere in the processing space PS is evacuated to a predetermined vacuum level by controlling the exhaust device 16. A predetermined amount of processing gas is supplied from the processing gas source 51 to the gas inlet 42b by controlling the valve 52. The processing gas is also supplied in a shower shape to the processing space PS in the chamber 10 through the plurality of gas outlets 42c and the plurality of gas inlets 43c.

A heat transfer gas is supplied to the heat transfer gas supply path 25a (between the electrostatic chuck 25 and the wafer W) by controlling the heat transfer gas supply 34. The coolant cooled to a predetermined temperature is circulated in the coolant circulation path 24a so as to cool the electrostatic chuck 25 by controlling the chiller unit 33. The heater controllers 70 control the temperature of the heaters 253 to reach a target temperature (set temperature).

High frequency power is supplied to the base member 24 on the placing table 20 by controlling the first high frequency power supply 35 and the second high frequency power supply 36. Plasma is formed between the placing table 20 and the shower head 40 in the processing space PS. A DC voltage of a predetermined magnitude is supplied from the variable DC power supply 55 to the shower head 40 by controlling the variable DC power supply 55 and the switch 57. The wafer W is etched by the plasma formed in the processing space PS. Examples of the plasma may include capacitively coupled plasma (CCP), inductively coupled plasma (ICP), radial line slot antenna plasma, electron cyclotron resonance plasma (ECR), helicon wave plasma (HWP) and the like.

After the wafer W is etched, the supply of high frequency power to the base member 24 of the placing table 20 is stopped by controlling the first high frequency power supply 35 and the second high frequency power supply 36. The application of DC voltage to the shower head 40 is stopped by controlling the variable DC power supply 55 and the switch 57. The opening 14 is opened by controlling the gate valve 17. The wafer W held by the electrostatic chuck 25 is released by controlling the DC power supply 31. The wafer W is carried out of the processing space PS in the chamber 10 through the opening 14. During plasma etching, the temperature of the wafer W can be appropriately adjusted to a predetermined temperature, and, thus, the wafer W can be appropriately etched.

The heater controllers 70 and the heaters 253 will be described in more detail. Hereinafter, a pair of the heater controller 70 and the heater 253 in the plurality of heater controllers 70 and the plurality of heaters 253 will be described, but the same applies to the other pairs of the heater controller 70 and the heater 253.

Figure 3:
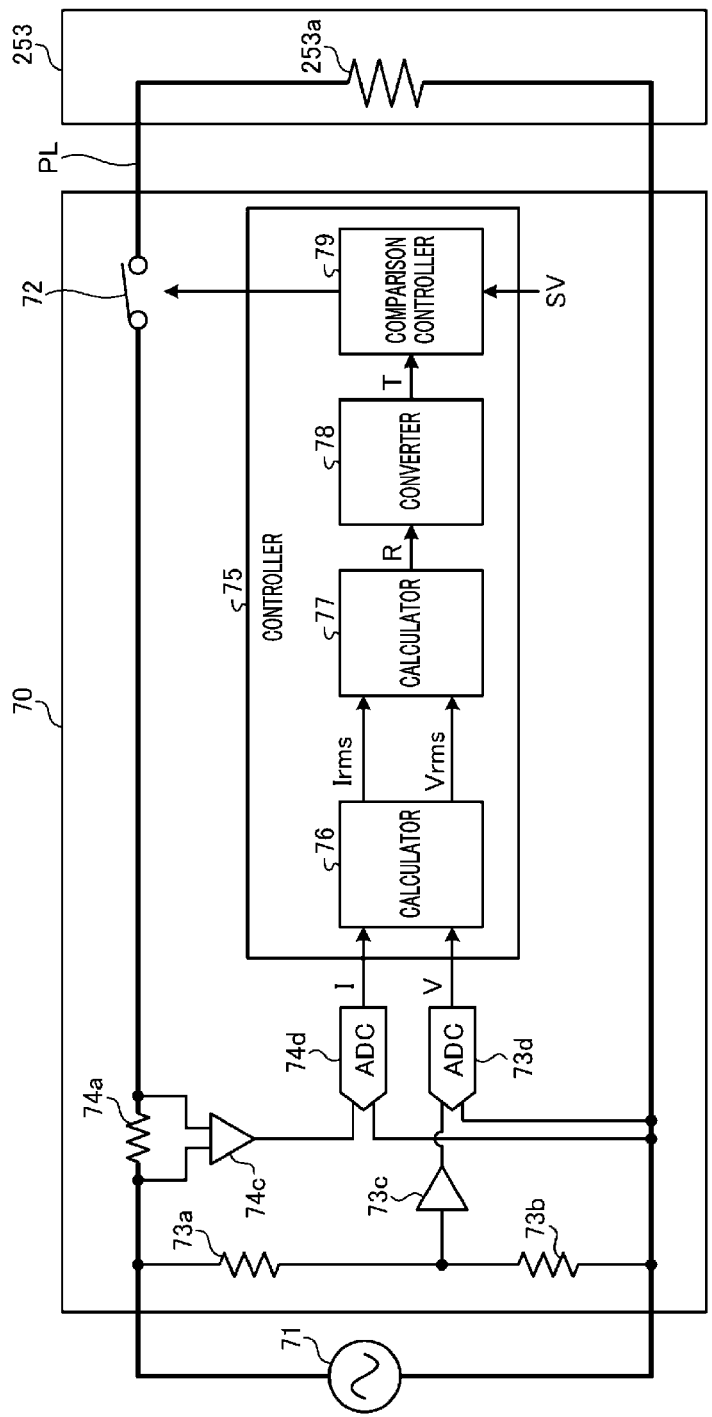
FIG. 3 is a diagram illustrating an example of a schematic configuration of a heater controller and a heater.

FIG. 3 is a diagram illustrating an example of a schematic configuration of a heater controller and a heater. A heater controller 70 is electrically connected between an AC power supply 71 and a heater 253. The heater 253 includes a heater resistor 253a. The heater resistor 253a is heated by a power applied thereto, that is, a voltage applied to the heater resistor 253a and a current flowing in the heater resistor 253a. The heater resistor 253a is made of, by way of non-limiting example, tungsten. The heater controller 70 heats the heater resistor 253a by using a power from the AC power supply 71. A main power path ranging from the AC power supply 71 to the heater resistor 253a is referred to and illustrated as a power line PL. In FIG. 3, a resistance value of the heater resistor 253a, which is a calculation result of a calculator 77 to be described later, is illustrated as a heater resistance value R. A temperature of the heater resistor 253a, which is a conversion result of a converter 78 to be described later, is illustrated as a heater temperature T. Further, the heater temperature T is assumed to be the same as a temperature of the heater 253.

The heater controller 70 includes a switch 72, a resistor 73a, a resistor 73b, an amplifier 73c, an AD converter (ADC: Analog to Digital Converter) 73d, a resistor 74a, an amplifier 74c, an AD converter 74d and a controller 75. The heater controller 70 may be configured as a substrate (heater control substrate) equipped with these components.

In the heater controller 70, the switch 72 and the resistor 74a are provided in series on the power line PL between the AC power supply 71 and the heater resistor 253a. The switch 72 may be, by way of non-limiting example, a TRIAC (bidirectional triode thyristor). The resistor 74a has a very small resistance value (for example, about 100 mΩ), and a voltage drop generated in the resistor 74a is much smaller than a voltage of the AC power supply 71. That is, when the switch 72 is turned on, a voltage corresponding to the voltage of the AC power supply 71 is applied to the heater resistor 253a. Further, a current corresponding to the current from the AC power supply 71 flows in the heater resistor 253a.

The heater controller 70 controls a conduction period of the switch 72 to make the temperature of the heater resistor 253a close to the set temperature. The conduction period may be a conduction period in a half (½) cycle of the AC power supply 71. By controlling the conduction period of the switch 72, not only the power supplied from the AC power supply 71 to the heater resistor 253a but also the heater temperature T can be controlled. To monitor the heater temperature T during this control, the heater resistance value R is calculated. This is because the heater resistance value R changes in a conventional manner as the heater temperature T changes.

The heater resistance value R is calculated based on the voltage applied to the heater resistor 253a and the current flowing in the heater resistor 253a.

The voltage applied to the heater resistor 253a is detected by the resistor 73a, the resistor 73b, the amplifier 73c, and the AD converter 73d. The resistor 73a and the resistor 73b are connected in series to divide the voltage of the AC power supply 71. The divided voltage is taken via the amplifier 73c to be outputted as a digital value by the AD converter 73d. The resistor 73a, the resistor 73b, the amplifier 73c, and the AD converter 73d are designed such that the digital value indicates a value corresponding to the magnitude of the actual voltage generated at both ends of the resistor 73a and the resistor 73b. This voltage outputted as the digital value by the AD converter 73d is referred to and illustrated as an output voltage V. The output voltage V is repeatedly outputted at an interval of, for example, several tens of microseconds (usec).

The current flowing in the heater resistor 253a is detected by the resistor 74a, the amplifier 74c, and the AD converter 74d. A voltage according to the magnitude of the current flowing in the heater resistor 253a is generated at both ends of the resistor 74a. This voltage is taken via the amplifier 74c to be outputted as a digital value by the AD converter 74d. The resistor 74a, the amplifier 74c, and the AD converter 74d are designed such that the digital value indicates a value corresponding to the magnitude of the actual current flowing in the resistor 74a. This current outputted as the digital value by the AD converter 74d is referred to and illustrated as an output current I. The output current I is a detection current detected as a voltage which is calculated from the heater resistor 253a and the current flowing in the heater resistor 253a and which is converted into a digital voltage value. The output current I is repeatedly outputted at an interval of, for example, several tens of microseconds (usec).

The output voltage V and the output current I may be multiple values (signals) outputted over a certain period. The minimum unit of this certain period may be one-half (½) of the cycle of the AC power supply 71. In this case, the certain period may be an integer multiple of the ½ cycle of the AC power supply 71.

The controller 75 controls the switch 72 based on the output voltage V and the output current I. In the example shown in FIG. 3, the controller 75 includes a calculator 76, the calculator 77, the converter 78, and a comparison controller 79.

The calculator 76 calculates a voltage and a current for calculating the heater resistance value R from the output voltage V and the output current I. The voltage for calculating the heater resistance value R is referred to as a calculation voltage. The current for calculating the heater resistance value R is referred to as a calculation current. The following description will be provided for a case where the calculation voltage is a root mean square (RMS) value of the output voltage V and the calculation current is a RMS value of the output current I.

The calculator 76 calculates the RMS value of the output voltage V and the RMS value of the output current I from the output voltage V and the output current I. The RMS value of the output voltage V and the RMS value of the output current I are repeatedly calculated every half cycle of the AC power supply 71, for example. A signal indicating a plurality of calculated RMS values is referred to as a RMS signal. Specifically, a RMS signal of the output voltage V is referred to as a voltage RMS signal Vrms, and a RMS signal of the output current I is referred to as a current RMS signal Irms.

The calculator 76 calculates the voltage RMS signal Vrms and the current RMS signal Irms to reduce impact of a noise of the AD converter 73d included in the voltage RMS signal Vrms and impact of a noise of the AD converter 74d included in the current RMS signal Irms based on a principle to be described later. Details of the calculator 76 will be described later with reference to FIG. 8 and more.

The calculator 77 calculates the heater resistance value R by using the voltage RMS signal Vrms and the current RMS signal Irms obtained by the calculator 76. The heater resistance value R is calculated by dividing a voltage RMS value indicated by the voltage RMS signal Vrms by a current RMS value indicated by the current RMS signal Irms. The voltage RMS value may be, for example, a single value indicated by the voltage RMS signal Vrms, or an average value of multiple values indicated by the voltage RMS signal Vrms. The current RMS value may be, for example, a single value indicated by the current RMS signal Irms, or an average value of multiple values indicated by the current RMS signal Irms.

The converter 78 converts the heater resistance value R calculated by the calculator 77 to the heater temperature T. By way of example, the heater temperature T may be calculated by using a polynomial for calculating the heater temperature T from the heater resistance value R. Alternatively, the heater temperature T may be calculated by referring to a data table in which the heater resistance values R and the heater temperatures T are matched. Further, the range of the heater resistance value R which varies according to the heater temperature T is very small (for example, about 1%), and the calculation of the heater resistance value R may be easily affected by an external factor such as a noise or the like. In this perspective view as well, improving calculation accuracy for the heater resistance value R is important to improve control accuracy for the heater temperature T.

The comparison controller 79 compares the heater temperature T as the conversion result of the converter 78 with a set value SV. The set value SV is a target temperature of the heater resistor 253a, and may be given from, for example, the outside of the heater controller 70. An example of the comparison result may be a difference between the heater temperature T and the set value SV. The comparison controller 79 controls the switch 72 based on the comparison result. By way of example, the comparison controller 79 controls the conduction period of the switch 72 such that the aforementioned difference as the comparison result is reduced. For example, when the switch 72 is the TRIAC, the comparison controller 79 generates a gate trigger voltage for controlling the conduction period, and supplies the generated gate trigger voltage to the TRIAC.

As stated above, the controller 75 controls the heater temperature T by using the output voltage V and the output current I. The controller 75 may be implemented by, for example, a FPGA (Field Programmable Gate Array), a CPU (Central Processing Unit), or the like. In this case, the calculator 76, the calculator 77, the converter 78, and the comparison controller 79 may be implemented by a FPGA. Alternatively, the calculator 76, the calculator 77 and the converter 78 may be implemented by a FPGA, and the comparison controller 79 may be implemented by a CPU.

In the heater controller 70 described above, the output voltage V outputted by the AD converter 73d includes the noise of the AD converter 73d. The output current I outputted by the AD converter 74d includes the noise of the AD converter 74d. The noises of the AD converters will be explained with reference to FIG. 4 and FIG. 5.

Figure 4:
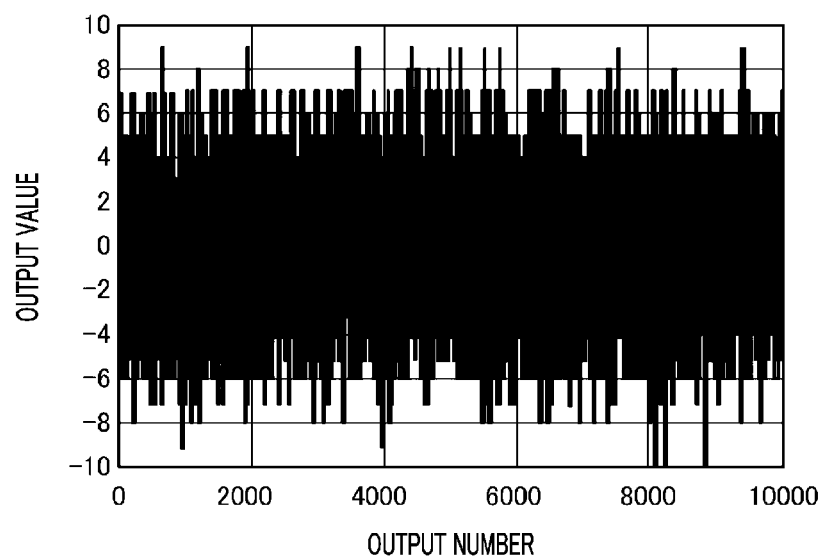
FIG. 4 is a diagram schematically illustrating a noise of an AD converter.

FIG. 4 is a diagram schematically illustrating a noise of an AD converter. A horizontal axis of the graph represents an output number, and a vertical axis of the graph indicates an output value (count value). Here, the output value of the AD converter is in a range from 0 to 21500. An input of the AD converter is zero (0), which implies that a pair of input terminals of the AD converter is short-circuited. As can be seen from FIG. 4, even when the input of the AD converter is zero (0), the AD converter outputs a value within a range of about ±10. This non-uniformity in the output values is the noise of the AD converter.

It is already known that the noise of the AD converter appears as a normal distribution, which will be explained with reference to FIG. 5.

Figure 5:
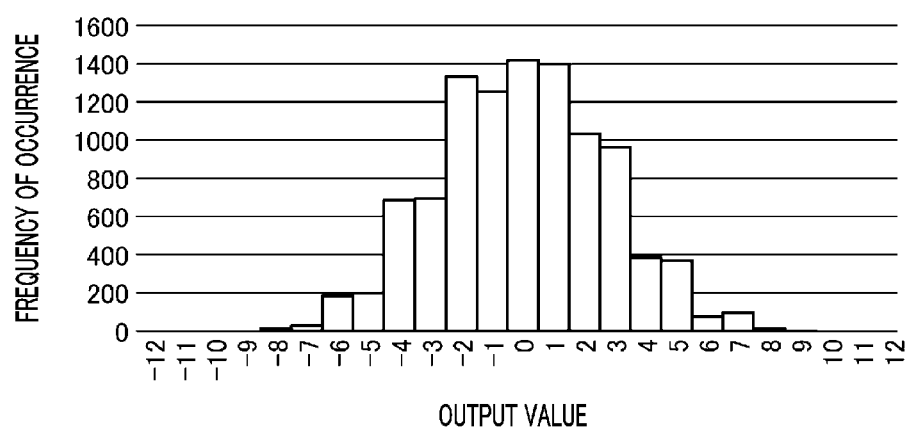
FIG. 5 is a diagram schematically illustrating a noise distribution of the AD converter.

FIG. 5 is a diagram schematically illustrating a noise distribution of the AD converter. A horizontal axis of the graph represents an output value, and a vertical axis thereof indicates a frequency of occurrence of the output value. It is found out that output values are distributed in a nearly normal distribution, centered on an average value of zero (0). The normal distribution is represented by the following expression (1), for example, in which u denotes an average value, and σ denotes a standard deviation.

[Expression 1]

$$f(x; \mu, \sigma^2) = \frac{1}{\sigma\sqrt{2\pi}} \exp\left[-\frac{1}{2}\left(\frac{x-\mu}{\sigma}\right)^2\right] \quad (1)$$

Since the noise of the AD converter approximates to the normal distribution as in the above expression (1), impact of the noise of the AD conversion upon the output voltage V and the output current I can be reduced by reducing a variance $\sigma^2$ thereof. This will be described with reference to FIG. 6.

Figure 6:
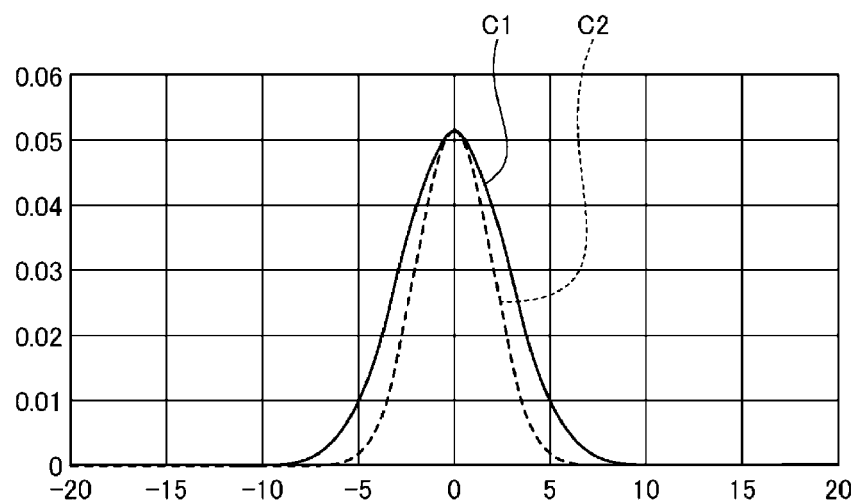
FIG. 6 is a diagram conceptually representing the principle of noise impact reduction.

FIG. 6 is a diagram conceptually representing the principle of the noise impact reduction. A horizontal axis of the graph represents an output value, and a vertical axis thereof indicates a probability density. A graph line C1 represents a probability density distribution when the average value u equals to 0.0 and the variance $\sigma^2$ equals to 7.795. A graph line C2 represents a probability density distribution obtained by squaring the probability density distribution of the graph line C1 and then multiplying a preset magnification (here, a magnification of 4.42) such that a peak of the graph line C2 coincides with a peak of the original graph line C1. The width of the probability density distribution shown by the graph line C2 is smaller than the width of the probability density distribution of the graph line C1, so that the variance $\sigma^2$ is also reduced.

Figure 7:
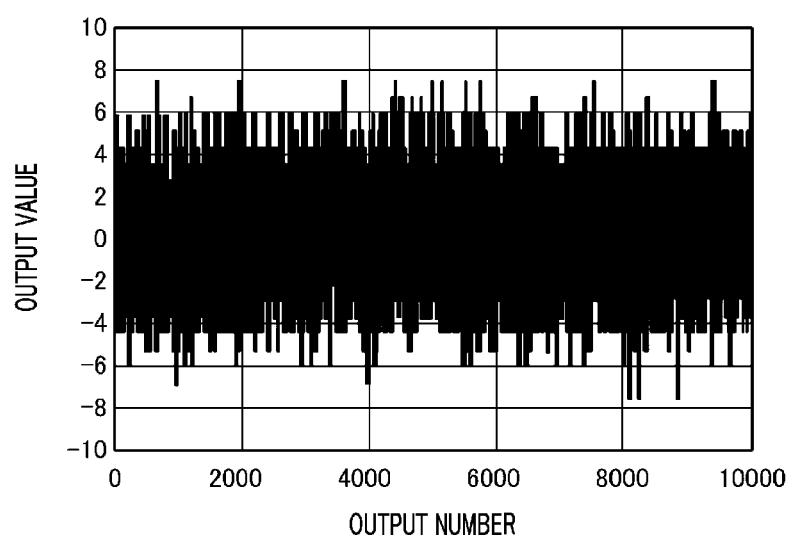
FIG. 7 is a diagram schematically illustrating a noise of the AD converter.

Based on the above-described principle, the impact of the noise of the AD converter can be reduced by, for example, multiplication of a normal distribution signal and a digital signal representing multiple values obtained from the output result of the AD converter. Examples of the digital signal include the voltage RMS signal Vrms and the current RMS signal Irms mentioned above. An example of the normal distribution signal is a noise signal including a white noise. By way of example, a noise signal having the same (or similar) peak as the digital signal and including the white noise is prepared, and by calculating a square root of the product of the digital signal and the noise signal, the impact of the noise of the AD converter included in the digital signal can be reduced. An example of the digital signal with the reduced impact of the noise is shown in FIG. 7. As can be seen from FIG. 7, the non-uniformity in output values is reduced, as compared to FIG. 4.

Referring back to FIG. 3, the calculator 76 reduces the impact of the noise of the AD converter 73d and the impact of the noise of the AD converter 74d, using the above-described principle. Details of this calculator 76 will be explained with reference to FIG. 8.

Figure 8:
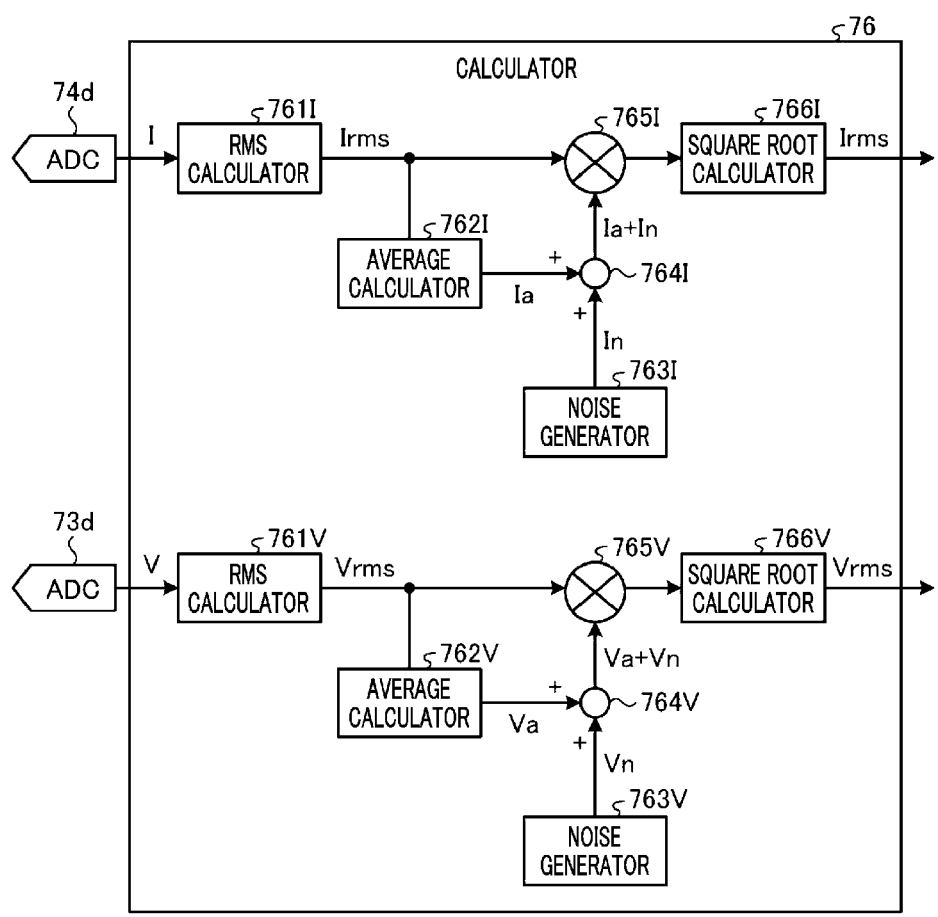
FIG. 8 is a diagram illustrating an example of functional blocks of a calculator.

FIG. 8 is a diagram illustrating functional blocks of the calculator. As shown in the lower part of FIG. 8, the calculator 76 includes, as components in relation to the output voltage V, a RMS calculator 761V, an average calculator 762V, a noise generator 763V, an adder 764V, a multiplier 765V, and a square root calculator 766V.

Figure 9:
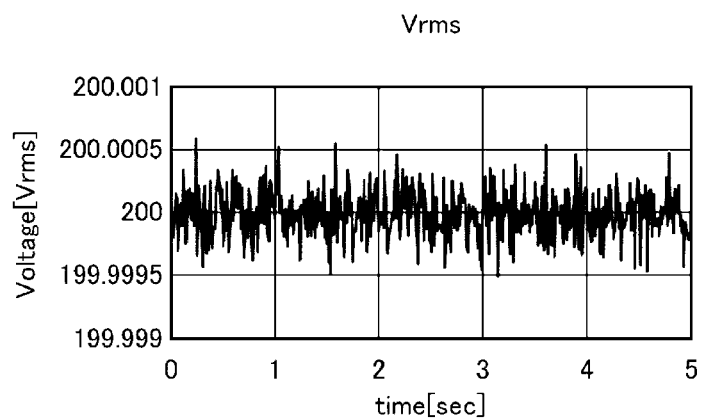
FIG. 9 is a diagram illustrating an example of a voltage RMS (Root Mean Square) signal.

The RMS calculator 761V calculates the voltage RMS signal Vrms from the output voltage V. An example of the voltage RMS signal Vrms calculated by the RMS calculator 761V is shown in FIG. 9. Since the voltage RMS signal Vrms calculated from the output voltage V outputted from the AD converter 73d includes the noise of the AD converter 73d (or the noise caused thereby), it has non-uniformity. The voltage RMS signal Vrms obtained by the RMS calculator 761V is sent to the average calculator 762V and the multiplier 765V.

The average calculator 762V calculates an average value of the voltage RMS signal Vrms calculated by the RMS calculator 761V. An example of the average value is a moving average value. The average value calculated by the RMS calculator 761V is referred to and illustrated as an average value Va.

The noise generator 763V generates a normal distribution noise. An example of the normal distribution noise is the white noise mentioned above. The normal distribution noise generated by the noise generator 763V is referred to and illustrated as a normal distribution noise Vn. An average value of the normal distribution noise Vn may be set to be, for example, zero (0) or a value close to zero (0). A variance of the normal distribution noise Vn may be set to be approximately equal to or smaller than the variance of the noise of the AD converter 73d.

Figure 10:
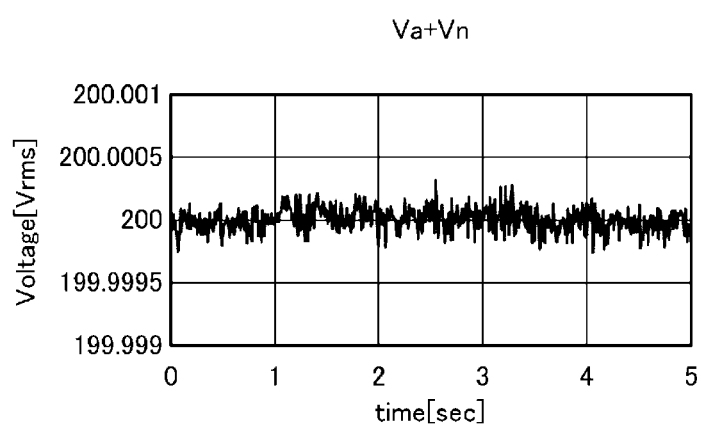
FIG. 10 is a diagram illustrating an example of a noise signal.

The adder 764V adds the average value Va calculated by the average calculator 762V and the normal distributed noise Vn generated by the noise generator 763V. As a result, a noise signal Va+Vn in which the normal distribution noise Vn is superposed to the average value Va is generated. An example of the generated noise signal Va+Vn is shown in FIG. 10. The noise signal Va+Vn has approximately the same peak as the voltage RMS signal Vrms. The noise signal Va+Vn generated by the adder 764V is sent to the multiplier 765V.

The multiplier 765V multiplies the voltage RMS signal Vrms and the noise signal Va+Vn generated by the adder 764V. This multiplication is one example of the combination of the voltage RMS signal Vrms and the noise signal Va+Vn. A multiplication result is an example of combination result of the voltage RMS signal Vrms and the noise signal Va+Vn. The multiplication result is sent to the square root calculator 766V.

Figure 11:
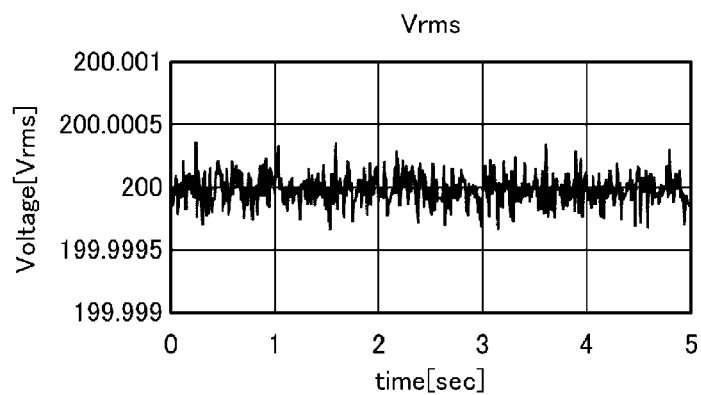
FIG. 11 is a diagram illustrating an example of a voltage RMS signal.

The square root calculator 766V re-calculates a voltage RMS signal Vrms by calculating a square root of the multiplication result from the multiplier 765V. This calculation of the square root is also an example of the combination of the voltage RMS signal Vrms and the noise signal Va+Vn. A calculation result is an example of a combination result of the voltage RMS signal Vrms and the noise signal Va+Vn. In the voltage RMS signal Vrms based on this combination result, the impact of the noise of the AD converter 73d is reduced due to the above-described principle of the noise impact reduction. An example of the voltage RMS signal Vrms with the reduced noise impact is shown in FIG. 11. As shown in FIG. 11, the non-uniformity in voltage values is reduced, as compared to FIG. 9. The voltage RMS signal Vrms with the reduced noise impact is sent to the calculator 77 described before with reference to FIG. 3.

As depicted in the upper part of FIG. 8, the calculator 76 includes, as components in relation to the output current I, a RMS calculator 7611, an average calculator 7621, a noise generator 7631, an adder 7641, a multiplier 7651, and a square root calculator 7661. Since these components are the same as the RMS calculator 761V, the average calculator 762V, the noise generator 763V, the adder 764V, the multiplier 765V and the square root calculator 766V, respectively, redundant description thereof will be omitted. As for relevant notations, an average value calculated by the average calculator 7621 will be referred to and illustrated as an average value Ia; a noise generated by the noise generator 7631, a normal distribution noise In; and a signal generated by the adder 7641, a noise signal Ia+In.

In the above-described substrate processing apparatus 1, the noise of the AD converter 73d included in the voltage RMS signal Vrms and the noise of the AD converter 74d included in the current RMS signal Irms are reduced by the calculator 76. As a result, the calculation accuracy of the heater resistance value R using the voltage RMS signal Vrms and the current RMS signal Irms by the calculator 77, the conversion accuracy of the heater temperature T by the converter 78, and, besides, the control accuracy over the heater temperature T by the comparison controller 79 in the subsequent processes are improved.

Figure 12:
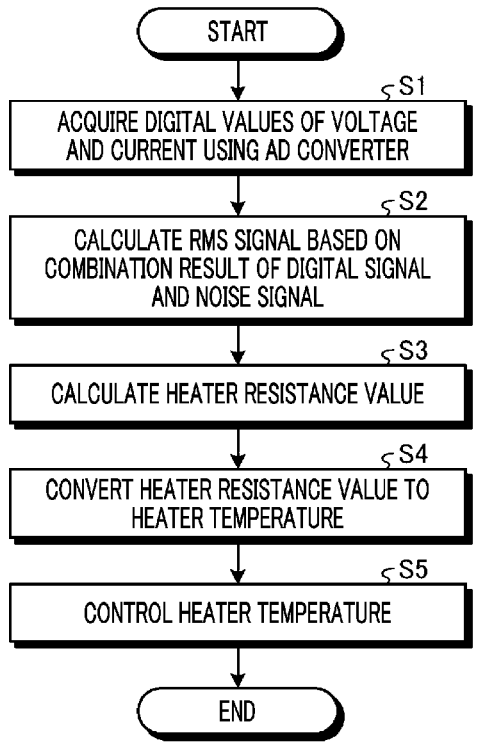
FIG. 12 is a flowchart illustrating an example of a processing (noise impact reducing method) performed in the substrate processing apparatus.

FIG. 12 is a flowchart illustrating an example of a processing (noise impact reducing method) performed in a substrate processing apparatus.

In process S1, digital values of a voltage and a current are acquired by using an AD converter. That is, the output voltage V is acquired by using the AD converter 73d, and the output current I is acquired by using the AD converter 74d, as stated above with reference to FIG. 3.

In process S2, a RMS signal is calculated based on a combination result of a digital signal and a noise signal. That is, the voltage RMS signal Vrms (an example of the digital signal) is calculated by using the RMS calculator 761V, as described above with reference to the lower part of FIG. 8. The noise signal Va+Vn is generated by using the average calculator 762V, the noise generator 763V and the adder 764V. The voltage RMS signal Vrms and the noise signal Va+Vn are multiplied by using the multiplier 765V. By calculating the square root of the multiplication result of the multiplier 765V using the square root calculator 766V, the voltage RMS signal Vrms is calculated again. Likewise, the current RMS signal Irms is calculated in the same way as described above with reference to the upper part of FIG. 8.

In process S3, the heater resistance value R is calculated. That is, by using the calculator 77, the heater resistance value R is calculated from the voltage RMS signal Vrms and the current RMS signal Irms obtained in the process S2, as described above with reference to FIG. 3.

In process S4, the heater resistance value R is converted to the heater temperature T. That is, as described above with reference to FIG. 3, the heater resistance value R calculated in the process S3 is converted to the heater temperature T by using the converter 78.

In process S5, the heater temperature T is controlled. That is, as described above with reference to FIG. 3, the switch 72 is controlled by using the comparison controller 79 such that the heater temperature T converted in the process S4 becomes approximate to the set value SV.

According to the above-described processing, in the process S2, the impact of the noise of the AD converter 73d included in the voltage RMS signal Vrms and the impact of the noise of the AD converter 74d included in the current RMS signal Irms are reduced. As a result, the calculation accuracy of the heater resistance value R in the subsequent process S3, the conversion accuracy of the heater temperature T in the process S4, and the control accuracy over the heater temperature T in the subsequent process S5 are improved.

It should be noted that the above-described exemplary embodiment is illustrative in all aspects and is not anyway limiting. The above-described exemplary embodiment may be omitted, replaced and modified in various ways without departing from the scope and the spirit of claims.

The above exemplary embodiment has bene described for the example where the multiplication by the multiplier 765V and the calculation of the square root by the square root calculator 766V in the calculator 76 are performed only one time. This is the same for the multiplier 7651 and the square root calculator 7661. However, these multiplications and the calculations may be performed more than one time, which will be explained with reference to FIG. 13.

Figure 13:
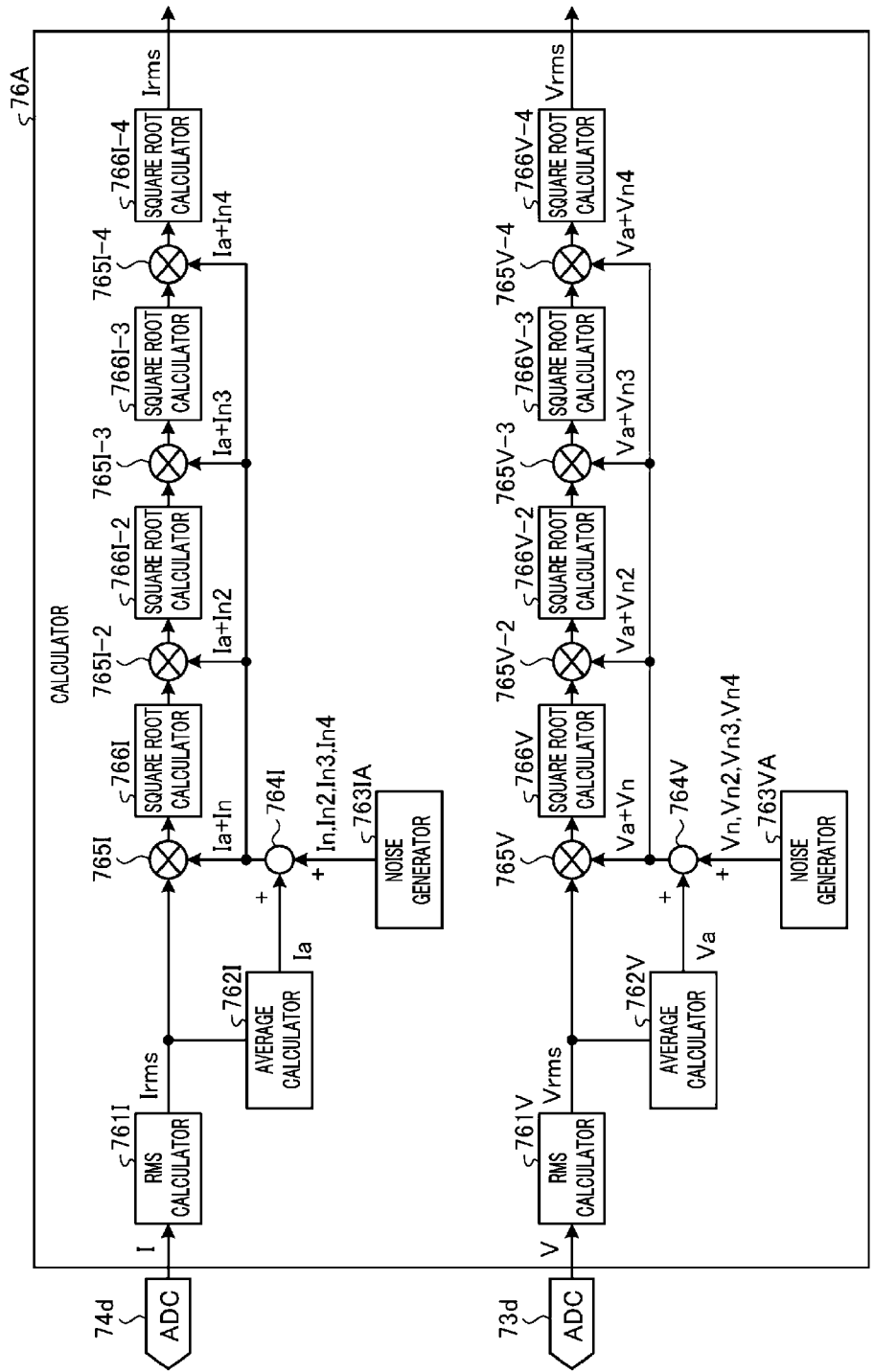
FIG. 13 is a diagram illustrating an example of functional blocks of a calculator.

FIG. 13 is a diagram illustrating an example of functional blocks of a calculator. As shown in the lower part of FIG. 13, in relation to the output voltage V, a calculator 76A is different from the calculator 76 (see FIG. 8) in that it has a noise generator 763VA instead of the noise generator 763V and further includes a multiplier 765V-2, a square root calculator 766V-2, a multiplier 765V-3, a square root calculator 766V-3, a multiplier 765V-4, and a square root calculator 766V-4.

The noise generator 763VA generates, in addition to the normal distribution noise Vn, a normal distribution noise Vn2, a normal distribution noise Vn3, and a normal distribution noise Vn4. If variances of the normal distribution noise Vn, the normal distribution noise Vn2, the normal distribution noise Vn3 and the normal distribution noise Vn4 are referred to as a variance $\sigma^2 n$, a variance $\sigma^2 n_2$, a variance $\sigma^2 n_3$ and a variance $\sigma^2 n_4$, respectively, these variance values may be set to meet a condition of variance $\sigma^2 n$>variance $\sigma^2 n_2$>variance $\sigma_2 n_3$>variance $\sigma^2 n_4$.

The multiplier 765V-2 multiplies a calculation result of the square root calculator 766V and a noise signal Va+Vn2. The square root calculator 766V-2 calculates a square root of the multiplication result of the multiplier 765V-2. The multiplier 765V-3 multiplies a calculation result of the square root calculator 766V-2 and a noise signal Va+Vn3. The square root calculator 766V-3 calculates a square root of the multiplication result of the multiplier 765V-3. The multiplier 765V-4 multiplies a calculation result of the square root calculator 766V-3 and a noise signal Va+Vn4. The square root calculator 766V-4 calculates a square root of the multiplication result of the multiplier 765V-4.

As stated above, the multiplication by the multiplier and the calculation by the square root calculator are repeated multiple times (four times in the present exemplary embodiment). Through the repetition of the processing, the impact of the noise can be further reduced, as compared to a case where the processing is performed only once. This will be discussed with reference to FIG. 14.

Figure 14:
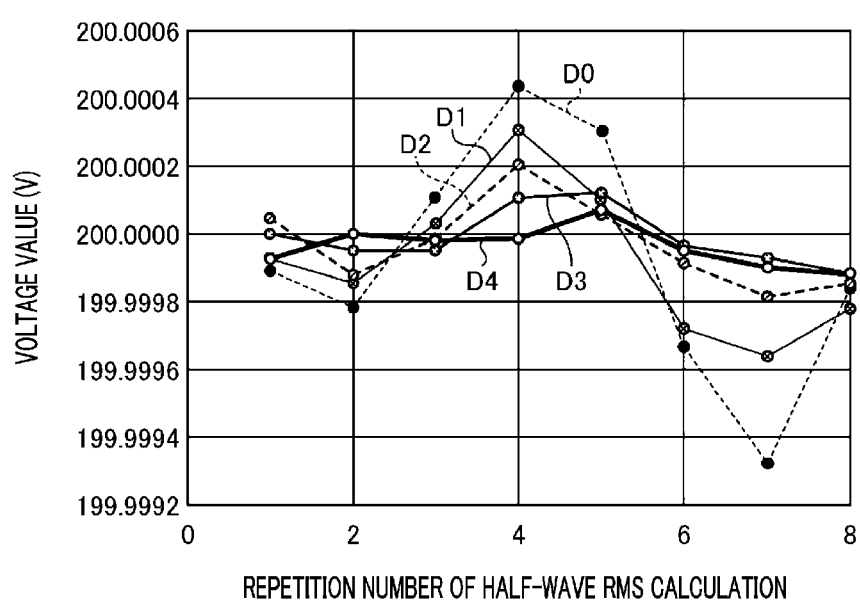
FIG. 14 is a diagram illustrating an example of noise impact reduction by repetitive processing.

FIG. 14 is a diagram illustrating an example of noise impact reduction by repetitive processing. A horizontal axis of the graph represents a repetition number of half-wave RMS calculation, and a vertical axis of the graph represents a voltage value. A graph line DO represents a voltage value before the processing, that is, a voltage value obtained from the calculation result of the RMS calculator 761V. A graph line D1 represents a voltage value obtained when the processing is performed only once, that is, a voltage value obtained from the calculation result of the square root calculator 766V. A graph line D2 represents a voltage value obtained when the processing is performed twice, that is, a voltage value obtained from the calculation result of the square root calculator 766V-2. A graph line D3 represents a voltage value obtained when the processing is performed three times, that is, a voltage value obtained from the calculation result of the square root calculator 766-3V. A graph line D4 represents a voltage value obtained when the processing is performed four times, that is, a voltage value obtained from the calculation result of the square root calculator 766V-4. As the repetition number of the processing increases, the non-uniformity in the voltage values is reduced, resulting in reduction of noise impact.

Referring back to FIG. 13, as shown in the upper part of FIG. 13, in relation to the output current I, the calculator 76A is different from the calculator 76 (see FIG. 8) in that it has a noise generator 763IA instead of the noise generator 763I and further includes a multiplier 7651-2, a square root calculator 7661-2, a multiplier 7651-3, a square root calculator 7661-3, a multiplier 7651-4 and a square root calculator 7661-4. Since these components are the same as the multiplier 765V-2, the square root calculator 766V-2, the multiplier 765V-3, the square root calculator 766V-3, the multiplier 765V-4 and the square root calculator 766V-4 as described above, redundant description thereof will be omitted. As for relevant notations, noises generated by the noise generator 763IA will be referred to and illustrated as a normal distribution noise In, a normal distribution noise In2, a normal distribution noise In3, and a normal distribution noise In4. A relationship between variances of these noises may be set to be the same as the relationship between the variances of the normal distribution noise Vn, the normal distribution noise Vn2, the normal distribution noise Vn3, and the normal distribution noise Vn4.

Further, the repetition number of the processing is not limited to the four times shown in FIG. 13, but it may be twice, three times, or more than four times.

The above exemplary embodiment has been described for the example where the impact of the noise of the voltage RMS signal Vrms and the impact of the noise of the current RMS signal Irms are both reduced. However, the impact of the noise of either one of the voltage RMS signal Vrms and the current RMS signal Irms may be reduced, which will be described with reference to FIG. 15 and FIG. 16.

Figure 15:
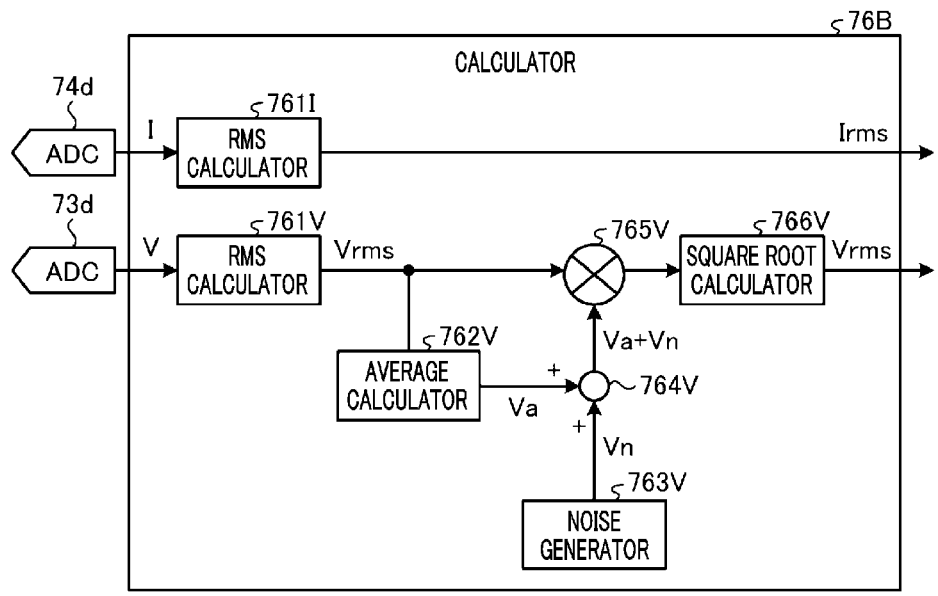
FIG. 15 is a diagram illustrating an example of functional blocks of a calculator.

A calculator 76B shown in FIG. 15 is different from the calculator 76 (see FIG. 8) in that it does not have the average calculator 762I, the noise generator 763I, the adder 764I, the multiplier 765I, and the square root calculator 766I. The voltage RMS signal Vrms is sent to the calculator 77 (see FIG. 3) after the impact of the noise is reduced as stated so far. The current RMS signal Irms, on the other hand, is sent to the calculator 77 without reducing the impact of the noise therefrom. In this case as well, the control accuracy over the heater temperature T is improved as much as the impact of the noise of the voltage RMS signal Vrms is reduced.

Figure 16:
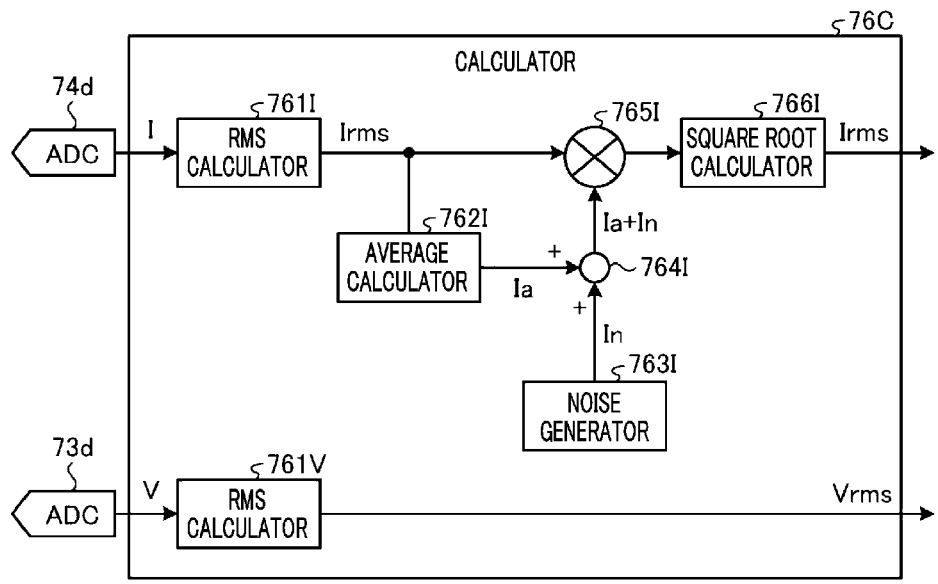
FIG. 16 is a diagram illustrating an example of functional blocks of a calculator.

A calculator 76C shown in FIG. 16 is different from the calculator 76 (see FIG. 8) in that it does not have the average calculator 762V, the noise generator 763V, the adder 764V, the multiplier 765V, and the square root calculator 766V. The voltage RMS signal Vrms is sent to the calculator 77 (see FIG. 3) without reducing the impact of the noise therefrom. The current RMS signal Irms, on the other hand, is sent to the calculator 77 after the impact of the noise is reduced therefrom as stated so far. In this case as well, the control accuracy over the heater temperature T is improved as much as the impact of the noise of the current RMS signal Irms is reduced.

The above exemplary embodiment has been described for the example where the calculation voltage and the calculation current for the heater resistance value R are the voltage RMS value and the current RMS value. However, without being limited to the RMS values of the voltage and the current, all types of voltages and currents that can be used to calculate the heater resistance values R may be used as the calculation voltage and the calculation current. The digital signals as a target of noise impact reduction are not limited to the voltage RMS signal Vrms and the current RMS signal Irms, either, and various types of signals may be used, depending on the types of the calculation voltage and the calculation current.

In the above-described exemplary embodiment, the AC power supply 71 is a commercial power supply. However, without being limited to the commercial power supply, various kinds of power supplies capable of supplying heating power to the heater resistor 253a may be used as the AC power supply 71.

The above exemplary embodiment has been described for the example where the heater 253 provided in the electrostatic chuck 25 is a control target of the heater controller 70. However, a heater that can be provided at any position within the substrate processing apparatus 1 may be included in the control target of the heater controller 70.

The above exemplary embodiment has been described for the example where the processing target of the substrate processing apparatus 1 is a semiconductor substrate such as the wafer W. However, the processing target of the substrate processing apparatus 1 is not limited thereto. For example, a substrate such as a liquid crystal or an organic EL may also be used as the processing target of the substrate processing apparatus 1.

The above-described substrate processing apparatus 1 is characterized as follows, for example. In the following description, the AD converter 73d and/or the AD converter 74d will be referred to as AD converter 73d, etc. The output voltage V and/or the output current I will be referred to as output voltage V, etc. The voltage RMS signal Vrms and/or the current RMS signal Irms will be referred to as voltage RMS signal Vrms, etc. The average value Va and/or the average value Ia will be referred to as average value Va, etc. The normal distribution noise Vn and/or the normal distribution noise In will be referred to as normal distribution noise Vn, etc. The noise signal Va+Vn and/or the noise signal Ia+In will be referred to as noise signal Va+Vn, etc.

As described above with reference to FIG. 1 to FIG. 16, the substrate processing apparatus 1 includes the AD converter 73d, etc., and the controller 75. The AD converter 73d, etc. outputs the digital values (output voltage V, etc.) of the voltage applied to the heater resistor 253a and the current flowing in the heater resistor 253a. The controller 75 controls the temperature of the heater resistor 253a (heater temperature T) by using the calculation voltage and the calculation current (for example, the voltage RMS value and the current RMS value) for calculating the resistance value of the heater resistor 253a (heater resistance value R) obtained from the output result of the AD converter 73d, etc., The controller 75 calculates at least one of the calculation voltage or the calculation current based on the combination result of the digital signal (for example, the voltage RMS signal Vrms, etc.) obtained from the output result from the AD converter 73d, etc. and the noise signal Va+Vn, etc. including the normal distribution noise Vn, etc. (for example, white noise).

In the above-described substrate processing apparatus 1, at least one of the calculation voltage or the calculation current for calculating the resistance value of the heater resistor 253a is calculated based on the combination result of the digital signal obtained from the output result from the AD converter 73d, etc. and the noise signal Va+Vn, etc. Accordingly, the impact of the noise of the AD converter 73d, etc. included in at least one of the calculation voltage or the calculation current is reduced. As a result, the calculation accuracy for the resistance value of the heater resistor 253a and, besides, the control accuracy for the temperature of the heater resistor 253a can be improved.

As described before with reference to FIG. 8 or the like, the noise signal Va+Vn, etc. is a noise signal Va+Vn, etc. in which the normal distribution noise Vn, etc. is superposed to the average value Va, etc. of the digital signal. The calculation by the controller 75 may include addition of the average value Va, etc. of the digital signal and the normal distribution noise Vn, etc. As a result, it is possible to generate the noise signal suitable for being combined with the digital signal and having the substantially same peak as the digital signal.

As stated above with reference to FIG. 8 or the like, the calculation by the controller 75 may include the multiplication of the digital signal and the noise signal Va+Vn, etc. The calculation by the controller 75 may include the calculation of the square root of the multiplication result of the digital signal and the noise signal Va+Vn, etc. Through these calculations, for example, the digital signal and the noise signal can be combined.

As described above with reference to FIG. 13 or the like, the calculation by the controller 75 may include repetition of each of the multiplication of the digital signal and the noise signal Va+Vn, etc. and the calculation of the square root of the multiplication result. With the increase of the repetition number, the variance $\sigma^2$ of the normal distribution noise Vn, etc. included in the noise signal may be reduced. By performing this repetitive processing, the impact of the noise can be further reduced.

As described above with reference to FIG. 1 or the like, the heater resistor 253a may be disposed in the placing table 20 for the substrate (for example, the wafer W). The heater resistor 253a may be embedded in the electrostatic chuck 25 provided in the placing table 20. With this configuration, the temperature of the placing table 20 for supporting the substrate and, also, the temperature of the electrostatic chuck 25 for holding the substrate on the placing table 20 can be controlled.

The noise impact reducing method described with reference to FIG. 13 or the like is one exemplary embodiment of the present disclosure. That is, the noise impact reducing method includes the process S1 of acquiring the voltage applied to the heater resistor 253a and the current flowing in the heater resistor 253a as the digital values by using the AD converter 73d, etc.; and the process S2 of calculating at least one of the calculation voltage or the calculation current for calculating the resistance value of the heater resistor 253a, based on the combination result of the digital signal obtained from the acquisition result of the process S1 and the noise signal Va+Vn, etc. including the normal distribution noise Vn, etc. According to this method, the impact of the noise of the AD converter 73d, etc. included in at least one of the calculation voltage or the calculation current can be reduced, as discussed so far. Therefore, the control accuracy for the temperature of the heater resistor 253a can be improved.

According to the exemplary embodiment, the control accuracy for the heater temperature can be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
   an AD converter configured to output digital values of a voltage applied to a heater resistor provided within an electrostatic chuck and a current flowing in the heater resistor; and
   a controller configured to control a temperature of the heater resistor by using a calculation voltage and a calculation current configured to calculate a resistance value of the heater resistor, which are obtained from an output result of the AD converter,
   wherein the controller includes a first calculator, a second calculator and a converter,
   the first calculator outputs the calculation voltage or the calculation current, which are calculated based on a multiplication result of a digital signal obtained from the output result of the AD converter and a noise signal including a normal distribution noise, to the second calculator,
   the second calculator outputs the resistance value of the heater resistor, which is calculated based on the calculation voltage and the calculation current, to the converter,
   the converter converts the resistance value to the temperature of the heater resistor.

2. The substrate processing apparatus of claim 1,
   wherein the noise signal is a noise signal in which the normal distribution noise is superposed to an average value of the digital signal, and
   the calculation by the first calculator includes addition of the average value of the digital signal and the normal distribution noise.

3. The substrate processing apparatus of claim 1,
   wherein the calculation by the first calculator includes calculation of a square root of a multiplication result of the digital signal and the noise signal.

4. The substrate processing apparatus of claim 1,
   wherein the digital signal is a root mean square signal.

5. The substrate processing apparatus of claim 1,
   wherein the calculation by the first calculator includes repetition of each of multiplication of the digital signal and the noise signal and calculation of a square root of a multiplication result.

6. The substrate processing apparatus of claim 5,
   wherein a variance of the normal distribution noise included in the noise signal decreases with an increase of a number of the repetition.

7. The substrate processing apparatus of claim 1,
   wherein the normal distribution noise is a white noise.

8. The substrate processing apparatus of claim 1,
   wherein the heater resistor is embedded in the electrostatic chuck included in a placing table configured to place thereon a substrate.

9. A noise impact reducing method, comprising:
   acquiring a voltage applied to a heater resistor provided within an electrostatic chuck and a current flowing in the heater resistor as digital values by using an AD converter;
   outputting a calculation voltage or a calculation current configured to calculate a resistance value of the heater resistor, which are calculated based on a multiplication result of a digital signal obtained from an acquisition result of the acquiring of the voltage and the current and a noise signal including a normal distribution noise;
   outputting the resistance value of the heater resistor, which is calculated based on the calculation voltage and the calculation current;
   converting the resistance value to a temperature of the heater resistor; and
   controlling the temperature of the heater resistor by using the calculation voltage and the calculation current.

* * * * *

UNITED STATES PATENT AND TRADEMARK OFFICE
CERTIFICATE OF CORRECTION

PATENT NO. : 12,200,826 B2
APPLICATION NO. : 17/411603
DATED : January 14, 2025
INVENTOR(S) : Kazuhito Yamada It is certified that error appears in the above-identified patent and that said Letters Patent is hereby corrected as shown below:

In the Specification

Column 9, Line 66, "u" should be -- µ --.

Column 10, Line 17, "u" should be -- µ --.

Column 11, Line 54, "7611" should be -- 761I --.

Column 11, Line 54, "7621" should be -- 762I --.

Column 11, Line 55, "7631" should be -- 763I --.

Column 11, Line 55, "7641" should be -- 764I --.

Column 11, Line 55, "7651" should be -- 765I --.

Column 11, Line 56, "7661" should be -- 766I --.

Column 11, Line 62, "7621" should be -- 762I --.

Column 11, Line 64, "761" should be -- 763I --.

Column 11, Line 65, "7641" should be -- 764I --.

Column 12, Line 66, "7651" should be -- 765I --.

Column 12, Line 67, "7661" should be -- 766I --.

Column 13, Line 45, "DO" should be -- D0 --.

Signed and Sealed this
Twenty-second Day of April, 2025

Coke Morgan Stewart
*Acting Director of the United States Patent and Trademark Office*

CERTIFICATE OF CORRECTION (continued)
U.S. Pat. No. 12,200,826 B2

Column 13, Line 67, "7631" should be -- 763I --.

Column 14, Line 1, "7651-2" should be -- 765I-2 --.

Column 14, Line 2, "7661-2" should be -- 766I-2 --.

Column 14, Line 2, "7651-3" should be -- 765I-3 --.

Column 14, Line 3, "7631-3" should be -- 766I-3 --.

Column 14, Line 3, "7651-4" should be -- 765I-4 --.

Column 14, Line 4, "7661-4" should be -- 766I-4 --.

Column 14, Line 31, "7621" should be -- 762I --.

Column 14, Line 31, "7631" should be -- 763I --.

Column 14, Line 31, "7641" should be -- 764I --.

Column 14, Line 32, "7651" should be -- 765I --.

Column 14, Line 32, "7661" should be -- 766I --.